US012578229B2

(12) United States Patent
Mendez et al.

(10) Patent No.: US 12,578,229 B2
(45) Date of Patent: Mar. 17, 2026

(54) CONTACTLESS SENSORS FOR A HEAD-MOUNTABLE DEVICE

(71) Applicant: Apple Inc., Cupertino, CA (US)

(72) Inventors: Javier Mendez, San Jose, CA (US); Darshan R. Kasar, San Francisco, CA (US); Grant H. Mulliken, Los Gatos, CA (US); Samuel G. Smith, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 334 days.

(21) Appl. No.: 18/347,126

(22) Filed: Jul. 5, 2023

(65) Prior Publication Data

US 2024/0035892 A1 Feb. 1, 2024

Related U.S. Application Data

(60) Provisional application No. 63/369,824, filed on Jul. 29, 2022.

(51) Int. Cl.
| | |
|---|---|
| *G01J 5/00* | (2022.01) |
| *G06F 1/16* | (2006.01) |
| *H05K 5/00* | (2006.01) |
| *G02B 27/01* | (2006.01) |

(52) U.S. Cl.
CPC ............ *G01J 5/0025* (2013.01); *G06F 1/163* (2013.01); *H05K 5/0018* (2022.08); *G02B 27/017* (2013.01)

(58) Field of Classification Search
CPC ...... G01J 5/0025; H05K 5/0018; G06F 1/163; G02B 27/017; G02B 27/0176
See application file for complete search history.

(56) References Cited

U.S. PATENT DOCUMENTS

| | | | |
|---|---|---|---|
| 10,656,710 B1 * | 5/2020 | Shahmohammadi ... | G06F 3/013 |
| 11,320,659 B1 | 5/2022 | Kasar et al. | |
| 2016/0077547 A1 * | 3/2016 | Aimone ............... | A61B 5/1114 |
| | | | 345/8 |
| 2016/0133170 A1 * | 5/2016 | Fateh ................. | G06F 3/04817 |
| | | | 345/428 |
| 2018/0096533 A1 | 4/2018 | Osman | |
| 2019/0079301 A1 | 3/2019 | Sauers et al. | |
| 2020/0233220 A1 | 7/2020 | Strongwater et al. | |
| 2021/0089150 A1 | 3/2021 | Wang et al. | |

FOREIGN PATENT DOCUMENTS

| | | | | |
|---|---|---|---|---|
| CN | 105388615 A | * | 3/2016 | ......... G02B 27/0176 |
| WO | WO-2019240564 A1 | * | 12/2019 | ............ A61B 5/024 |

OTHER PUBLICATIONS

Computer translation of CN105388615 (Year: 2020).*
Computer translation of WO 2019-24065 from the EPO website (Year: 2021).*
Extended European Search Report for EP Application No. 23188117.8 dated Jan. 8, 2024.

* cited by examiner

*Primary Examiner* — Randy W Gibson
(74) *Attorney, Agent, or Firm* — Dorsey & Whitney LLP

(57) ABSTRACT

An apparatus includes a display, a facial interface, interface material positioned on the facial interface, the interface material including a first surface that abuts the facial interface and a second opposing the first surface, and a sensor positioned on the facial interface or within the interface material, the sensor being oriented towards the second surface, and at least a portion of the interface material being sensorally transparent and positioned between the sensors and the second surface.

20 Claims, 5 Drawing Sheets

DISPLAY SIDE
326

USER SIDE
324

CONTACTLESS SENSORS FOR A HEAD-MOUNTABLE DEVICE

CROSS-REFERENCE TO RELATED APPLICATION(S)

This claims priority to U.S. Provisional Patent Application No. 63/369,824, filed 29 Jul. 2022, and entitled "CONTACTLESS SENSORS FOR A HEAD-MOUNTABLE DEVICE," the entire disclosure of which is hereby incorporated by reference.

FIELD

The described embodiments relate generally to a facial interface in a head-mountable device. More particularly, the present embodiments relate to a facial interface in a head-mountable device that contains sensorally transparent materials.

BACKGROUND

Recent advances in portable computing have enabled head-mountable devices (HMD) that provide augmented and virtual reality (AR/VR) experiences to users. These head-mountable devices have many components, such as a display, a viewing frame, a lens, a battery, and other components. Certain components of the head-mountable devices engage with a user's face (e.g., via direct contact with a user's skin). Such components can affect a user experience, especially during long periods of use.

Head-mountable devices are also equipped with sensors. These sensors can be utilized for different purposes, such as detecting a user's environment. To make use of such sensors, an arrangement of sensors that comports with the structure, materials, etc. of a head-mountable device are needed.

Unfortunately, sensors in conventional head-mountable devices are implemented in rudimentary ways (if any) that limit a user experience, creating user discomfort or dissatisfaction. Indeed, sensors in conventional head-mountable devices can lend to bulky, heavy, and/or cumbersome devices. Likewise, conventional head-mountable devices that do implement a sensor, do so with certain drawbacks or limitations, such as failing to quantitatively detect aspects of a user experience or a user response. Thus, blind to a user experience, sensors of conventional head-mountable devices can be insufficient to provide a comfortable, immersive user experience.

SUMMARY

In at least one example of the present disclosure, an apparatus includes a display, a facial interface, and an interface material positioned on the facial interface. The interface material can include a first surface that abuts the facial interface, and a second surface opposing the first surface. The apparatus further includes a sensor positioned on the facial interface or within the interface material, the sensor being oriented towards the second surface, and at least a portion of the interface material being sensorally transparent and positioned between the sensors and the second surface.

In one example, the facial interface includes a sensorally transparent window through which sensor signals to or from the sensor can pass. In one example, the sensor is positioned at the sensorally transparent window. In one example, the sensor includes an infrared sensor. In one example, the second surface abuts a forehead region or a nasal region when the apparatus is donned. In one example, the apparatus can further include a sensor controller, the sensor controller including a processor and a memory device storing computer-executable instructions that, when executed by the processors, cause the sensor controller to receive sensor data from the sensor, and cause the controller to transmit a signal based on the sensor data. In one example, the display powers off, presents a digital notification, or renders at least one of an avatar or an avatar emotional response. In on example, at least one of the facial interface or the interface material is interchangeable with a different facial interface or a different interface material, the different facial interface of the different interface material including a different sensor.

In at least one example, an apparatus including a facial interface including a first surface and a second surface opposing the first surface, a sensor positioned on the first surface, and an interface material positioned on the second surface, wherein the first surface, the second surface, and the interface material are sensorally transparent.

In one example, the sensor includes a biometric sensor that includes a temperature sensor, a respiration sensor, a heart activity sensor, or a brain activity sensor. In one example, the sensor is a wireless sensor. In one example, the apparatus includes support structures moveably constrained to the first surface, the sensor being interspaced between the support structures. In one example, the facial interface includes a pliable region, the sensor being positioned at the pliable region. In one example, the interface material includes at least one of foam, gel, or fabric. In one example, the interface material is removable attached to the second surface via a fastener.

In at least one example, an electronic device incudes a wearable display, an engagement interface, and a contactless sensor coupled to the engagement interface, the contactless sensor oriented away from the wearable display.

In one example, the wearable display includes a head-mountable display, and the engagement interface is adjustable for different sizes, shapes, and contours of facial features. In one example, the engagement interface includes an interfacing material, the contactless sensor being invisible and inaccessible through a skin-facing surface of the interfacing material. In one example, the contract less sensor is oriented toward a first facial region when the electronic device is worn. In one example, an additional contactless sensor is coupled to the engagement interface, the additional contactless sensor oriented toward a second facial region being different from the first facial region when the electronic device is worn.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
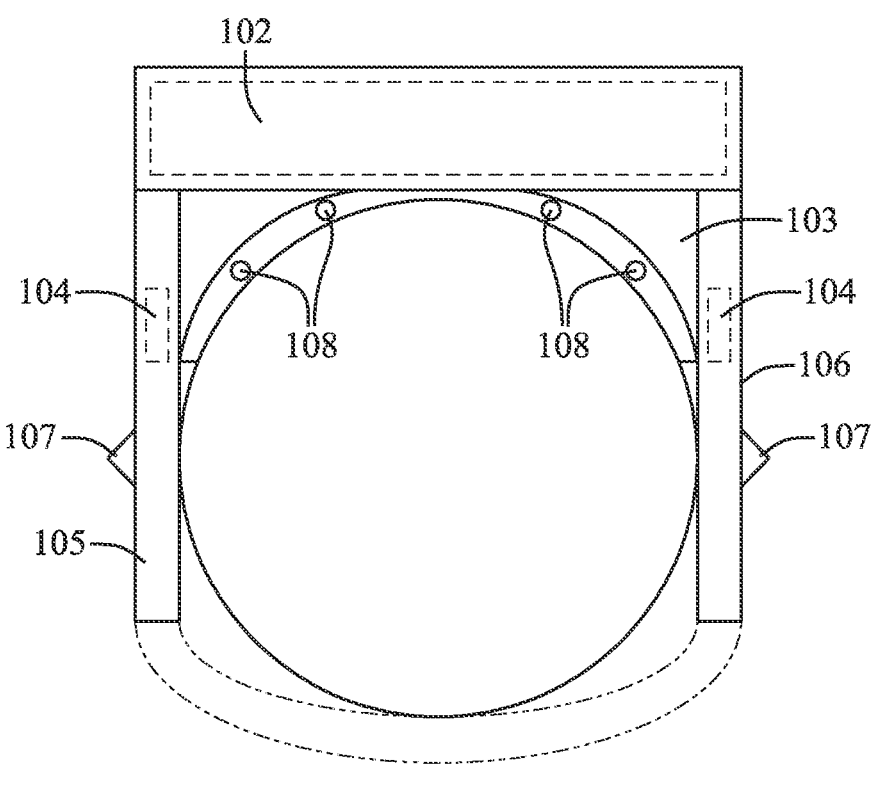
FIG. 1 shows a top view profile of a head-mountable device including a facial interface.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to a facial interface in a head-mountable device. More particularly, the present embodiments relate to a facial interface that contains sensorally transparent materials for head-mountable devices used for AR/VR experiences. These facial interfaces can enable sensors to interact with a user through sensorally transparent materials. As used herein, the term "sensorally transparent materials" include materials that allow for the transfer of sensor signals therethrough.

In one example, the head-mountable device of the present disclosure includes a display and a light seal portion (hereafter "light seal"). Light seals enable a user to experience a light shielded environment, where outside ambient light and possibly other environmental items, are blocked form the user field of view. The shielded environment allows for better user interaction and a more immersive experience. The light seal, as a facial interface, can be customized to a user's facial profile such that the light seal physically interacts with the user's face to fit snugly on or around the forehead, eyes, nose, and other features or bones, such as the maxilla regions, that can vary user to user. Additionally, a light seal can include components connecting the display to the facial interface, such as a webbing, housing or a frame positioned between the display and facial interface.

Conventional light seals of conventional head-mountable devices are passive and do not include a facial interface with sensorally transparent materials. Indeed, passive light seals create a light shielded environment, but do not include active component integration to enable contactless readings from sensors embedded in a facial interface. Therefore, conventional light seals do not provide contactless readings of a user via sensorally transparent materials and sensors.

By contrast, a light seal of the present disclosure includes a facial interface with sensorally transparent materials for active component integration. A light seal with active components has advantages over a traditional passive light seal. A light seal with sensorally transparent materials can include active components that can monitor user responses without direct contact, lending to improved user comfort while wearing the head-mountable device. Sensors configured in this contactless manner can also avoid biological ingress from user skin (e.g., lotion, makeup, sunscreen, etc.). A head-mountable device that monitors such user responses can also create a highly customized user experience (unlike the sensors of conventional head-mountable devices that are "blind" to the user experience).

Sensors can be important for creating a customized user experience. An active light seal can contain sensors to measure a user's response or engagement via indicators, such as core body temperature, sweat, heart rate, electrical signals from the heart (e.g., ECG, EKG, EXG, etc.), brain activity (e.g., EEG signals, frontal lobe activity), etc. Additionally, the sensor data can be used as feedback data, for example, to monitor user fatigue or obtain activity-specific metrics.

Sensors of the present disclosure can be implemented on or within a facial interface in myriad different ways. For example, a sensor can be oriented towards a user and positioned on a facial interface surface opposite of the surface that contacts a user. In another example, a sensor can be oriented towards a user and embedded inside the facial interface. In these or other examples, the sensor can include a field of view that projects towards a user and through at least a portion of the facial interface. Thus, such portions of the facial interface can be sensorally transparent to allow the sensor to obtain a sensor reading through at least a portion of the facial interface.

Sensors can also be implemented in different ways for different facial interfaces. That is, the head-mountable device of the present disclosure can implement a facial interface with a base layer and an interchangeable layer. The interchangeable layer can be exchanged or swapped out for a different interchangeable layer. In some examples, the different interchangeable layer can correspond to a different user activity, such as a yoga activity versus a movie-watching activity. In certain implementations, the yoga interchangeable layer can include a different sensor arrangement than the movie-watching interchangeable layer (e.g., for obtaining different, activity-specific metrics).

These and other embodiments are discussed below with reference to FIGS. 1-7B. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1 illustrates a top view profile of a head-mountable device 100 worn on a user head. The head-mountable device 100 can include a display 102 (e.g., one or more optical lenses or display screens in front of the eyes of the user). The display 102 can include a display for presenting an augmented reality visualization, a virtual reality visualization, or other suitable visualization.

The head-mountable device 100 also includes a facial interface 103 and a sensor 108 positioned (e.g., attached to or embedded within) on the facial interface 103. As used herein, the terms "facial interface" or "engagement interface" refer to a portion of the head mountable device 100 that engages a user face via direct contact. In particular, a facial interface includes portions of the head-mountable device 100 that conform to (e.g., compress against) regions of a user face. To illustrate, a facial interface can include a pliant (or semi-pliant) facetrack that spans the forehead, wraps around the eyes, contacts the zygoma and maxilla regions of the face, and bridges the nose. In addition, a facial interface can include various components forming a structure, webbing, cover, fabric, or frame of a head-mountable device disposed between the display 102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

In addition, the term "sensor" refers to one or more different sensing devices, such as a camera or imaging device, temperature device, oxygen device, movement device, brain activity device, sweat gland activity device, breathing activity device, muscle contraction device, etc. Some particular examples of sensors include an electrooculography sensor, electrocardiography sensor, EKG sensor, hear rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc.

In one example, the head mountable device 100 includes a sensor controller 104. The sensor controller 104 can include a processor (e.g., a system on chip, integrated circuit, driver, microcontroller, application processor, crossover processor, etc.). Further the sensor controller 104 can include one or more memory devices (e.g., individual nonvolatile memory, processor-embedded nonvolatile memory, random access memory, memory integrated circuits, DRAM chips, stacked memory modules, storage devices, memory partitions, etc.). In certain implementations, the sensor controller 104 is positioned within one or both arms 105, 106 of the head-mountable device 100 (e.g., for integration with an HMD processor/memory component). In alternative implementations, the sensor controller 104 is physically integrated within the sensors 108 themselves.

The sensor controller 104 can perform myriad different functions. For example, the memory device can store computer-executable instructions that, when executed by the processor, cause the sensor controller 104 to receive sensor data from the sensors 108 and transmit a signal based on the sensor data. For instance, the sensor controller 104 can transmit a sensor signal to the display 102. In response to the sensor signal, the display 102 can power off, present a digital notification (e.g., user-generated notification, push notification, context-generated notification, system-generated notification, smart notification, etc.), or render at least one of an avatar or an avatar emotional response. As used herein, the term "avatar" is a visual representation of a person for use in digital context, such as with the head mountable device 100. An avatar can include animated characters, animals, objects, emojis, etc. that can depict human emotion (e.g., as detected via the sensors 108 of the head-mountable device 100). The depiction of human emotion through an avatar constitutes an avatar emotional response.

Additionally shown in FIG. 1, the head-mountable device 100 includes one or more arms 105, 106. The arms 105, 106 are connected to the display 102 and extend distally toward the rear of the head. The arms 105, 106 are configured to secure the display 102 in a position relative to the head (e.g., such that the display 102 is maintained in front of a user's eyes). For example, the arms 105, 106 extend over the user's ears 107. In certain examples, the arms 105, 106 rest on the user's ears 107 to secure the head-mountable device 100 via friction between the arms 105, 106 and the head. Additionally, or alternatively, the arms 105, 106 can rest against the head. For example, the arms 105, 106 can apply opposing pressures to the sides of the head to secure the head-mountable device 100 to the head. Optionally, the arms 105, 106 can be connected to each other via a strap (shown in dashed lines) that can compress the head-mountable device 100 against the head).

Any of the features, components, and/or parts, including the arrangements and configurations thereof shown in FIG. 1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 1.

Figure 2A:
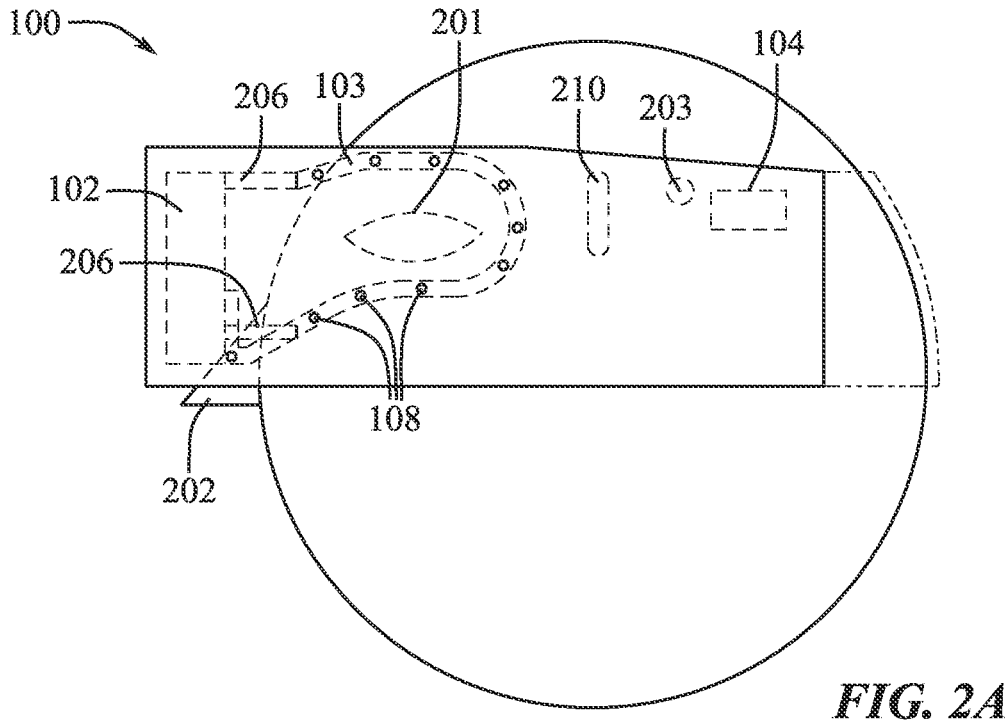
FIG. 2A shows a side view of a head-mountable device including a facial interface.
Figures 2B, 3:
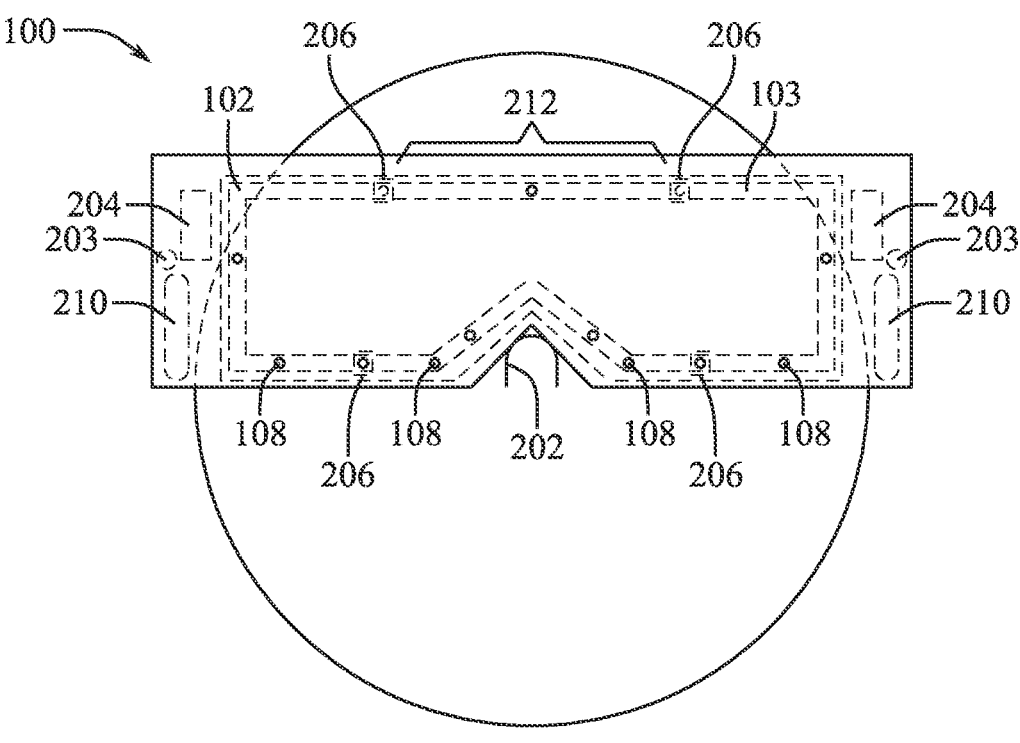
FIG. 2B shows a front view of a head-mountable device including a facial interface.
FIG. 3 shows a top view of a facial interface with a sensor.

FIG. 2A-2B respectively illustrate a side view and front view profiles of an example of the head mountable device 100. As discussed above, the head mountable device 100 includes the display 102, the facial interface 103, the sensor controller 104, and the sensors 108. Indeed, at least one sensor 108 is positioned on or within the facial interface 103. Additionally, the facial interface 103 can wrap around eyes 201 and bridge a nose 202 of a user. The head-mountable device 100 can also include connections 206 that movably constrain the display 102 and the facial interface 103 (e.g., at forehead and cheek regions of a user face). Examples of the connections 206 include a pivot connection, spring connection, etc.

The sensors 108 can be positioned in myriad different configurations. In one example, at least one of the sensors 108 is positioned in a pliant region 212 of the facial interface 103 between the connections 206. A "pliant region" refers to the portion(s) of the facial interface 103 disposed between the connections 206, where the facial interface 103 is more flexible and conformable. In certain implementations, one or more of the sensors 108 is positioned in a middle portion of the pliant region 212 (approximately equidistant from the connections 206). By positioning one or more of the sensors 108 within the pliant region 212, pressure points felt by the user can be mitigated. Additionally, or alternatively, the sensors 108 can be positioned in certain configurations, depending on the desired location (on the user) to be sensed (e.g., a forehead region, an eye region, a nasal region, etc.).

Further, the term "forehead region" refers to the anatomical area of a human head between the eyes and scalp. Additionally, the term "nasal region" refers to the anatomical area of a human nose.

Also shown in FIGS. 2A-2B, the head-mountable device 100 can include a power source 203. In some examples, the power source 203 can include one or more electrochemical cells with connections for powering electrical devices. For example, in some examples, the power source 203 includes a lithium-ion battery, alkaline battery, carbon zinc battery, lead-acid battery, nickel-cadmium battery, nickel-metal hydride battery, etc. It will therefore be appreciated that the power source 203 can be dispensable or rechargeable, as may be desired. In certain implementations, the power source 203 is connected to the sensor controller 104 via one or more electrical connections. In some examples, though not required, the power source 203 is mounted to the sensor controller 104.

The head-mountable device 100 can also include an interface 210, which can be electromechanical or wireless. The interface 210 can communicatively couple the sensors 108 to at least one of the power source 203, the sensor controller 104, or an HMD processor/memory component (not shown).

In some examples, the sensor 108 can connect to the sensor controller 104 (or the HMD processor/memory component, not shown) via certain wireless communication protocols, such as via a wireless local area network protocol, wireless area network protocol, wireless personal area network protocol, wide area protocol, etc. Some particular examples of wireless communication via such protocols include a Wi-Fi based communication, mesh network communication, BlueTooth® communication, near-field communication, low-energy communication, Zigbee communication, Z-wave communication, and 6LoWPAN communication. In a particular implementation, the sensor 108 is communicatively coupled to the sensor controller 104 (or the HMD processor/memory component, not shown via a wireless 60 GHz frequency.

Any of the features, components, and/or parts, including the arrangements and configurations thereof shown in FIGS. 2A-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 2A-2B.

As discussed above, sensors can be disposed on or within the facial interface of the present disclosure. In accordance with one or more such examples, FIG. 3 illustrates one of the sensors 108 positioned on a surface of the facial interface 103. Specifically, as shown in FIG. 3, the sensor 108 is positioned on a first surface 318 oriented towards a user side 324 (and away from a display side 326). Additionally, the sensor 108 includes a field of view 320 that crosses through an interface material 301 from the first surface 318 to a second surface 322 opposing the first surface 318. Thus, the portion of the interface material 301 corresponding to the field of view 320 between the first surface 318 and the second surface 322 can be sensorally transparent—constituting a sensorally transparent window through the interface material 301.

The terms "sensorally transparent" refers to a type of material penetrable by a sensor measurement signal without substantial loss to the quality or accuracy of the sensor measurement signal (where "substantial" means greater than about 5%, about 10%, about 25%, about 50%, or greater than 50% discrepancy from a ground truth signal). For example, a sensorally transparent material can allow a heart rate sensor to accurately detect electrical, magnetic, or audio heart data indicative of a heart palpation, heartbeat, heart rhythm, etc. despite the sensorally transparent material being disposed between the heart rate sensor and the user. The sensor measurement signal is therefore a wireless signal to and/or from a sensor, where the wireless signal comprises wavelike properties (e.g., frequency, amplitude, etc.) that allow the wireless signal to propagate through the sensorally transparent material.

Relatedly, the term "sensorally transparent window" refers to the portion of the interface material 301 that is sensorally transparent. In some examples, the sensorally transparent window includes an entirety of the interface material 301. In other examples, the sensorally transparent window includes at least a portion of the interface material 301 for the field of view 320. In these or other examples, the sensorally transparent window can be sized and shaped according to the field of view 320.

The interface material 301 composes or defines (at least in part) the facial interface 103. The interface material 301 can include the first surface 318 and the second surface 322 opposing the first surface 318, as illustrated in at least FIG. 3. In at least some examples, the second surface 322 is configured to contact user skin.

Additionally, the interface material 301 can include at least one of foam, gel, or fabric. The interface material 301 can likewise include a combination of foam (e.g., polyurethane foam cushion, cotton foam), gel (e.g., silicone, polyurethane, etc.), or fabric (e.g., cotton, leather, leatherette, etc.). For example, the interface material 301 can include multiple different layers (e.g., an outer leatherette layer forming the second surface 322 and a foam layer underneath forming the first surface 318). The combination described is merely exemplary and other embodiments, materials, configurations and/or combinations are contemplated herein.

Any of the features, components, and/or parts, including the arrangements and configurations thereof shown in FIG. 3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 3.

Figure 4:
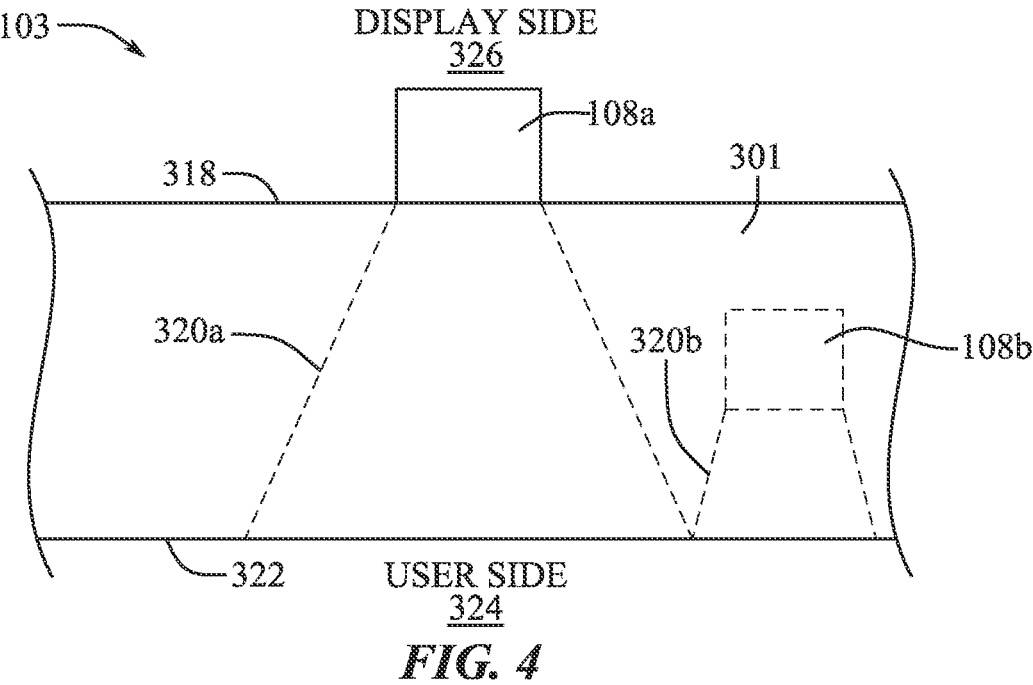
FIG. 4 shows a top view of a facial interface with multiple sensors at various positions.

Other sensor arrangements are also within the scope of the present disclosure. In accordance with one or more examples, FIG. 4 illustrates the facial interface 103 which can include sensorally transparent windows through which sensor measurement signals to or from the sensors 108a, 108b can pass. The sensors 108a, 108b can detect physiological or biological changes of the user's body through corresponding fields of view 320a, 320b. For example, a head-mountable device 100 can detect changes to a user body temperature or a heat profile via an infrared sensor. Other biological sensors can be added or substituted, as may be desired.

In particular, FIG. 4 shows the sensor 108a in a same or similar position as described above in relation to FIG. 3. The sensor 108a is positioned as a contactless sensor on the first surface 318 (i.e., on the display side 326). In addition, FIG. 4 shows the facial interface 103 includes the sensor 108b disposed between the first surface 318 and the second surface 322. That is, the sensor 320b is embedded within the facial interface 103 such that the sensor 320b is invisible and inaccessible from the second surface 322 (i.e., the skin-facing surface). By being offset from the second surface 322, the sensor 108b is also a contactless sensor.

In one or more examples, the sensors 108a, 108b are the same type of sensors (albeit positioned differently). In other examples, the sensors 108a, 108b are different types of sensors. Similarly, the sensors 108a, 108b can have the same field of view or a different field of view, as may be desired. Alternative embodiments can also include the same or different sensors with alternative fields of view. For instance, the fields of view 320a, 320b can be oriented or angled towards a particular location along the second surface 322 (e.g., for measuring a particular location on the user). Additionally, or alternatively, the fields of view 320a, 320b can intersect, overlap, and/or include mutually exclusive measurement regions.

One of ordinary skill in the art will appreciate that the sensor depth for the sensor 320b can vary any distance from the first surface 318 to the second surface 322. An example of sensor depth variation is shown where the sensor 108a is on the first surface 318 of the interface material 301, which increases the sensor field of view 320a. Similarly, sensor 108b is a distance from the first surface 318, being disposed within the interface material 301, and therefore closer to the second surface 322 than the sensor 108a. In some instances, this closer positioning of the sensor 108b to the second surface 322 can correspondingly reduce the field of view 320b. This is only one example variation of sensor depth, as a multitude of sensors can be disposed on the first surface 318 of the interface material 301, or between the first surface 318 and the second surface 322, within the interface material 301. In one example, the second surface 322 abuts a forehead region or a nasal region of a user head when the head-mountable device 100 is donned.

Any of the features, components, and/or parts, including the arrangements and configurations thereof shown in FIG. 4 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 4.

Figure 5:
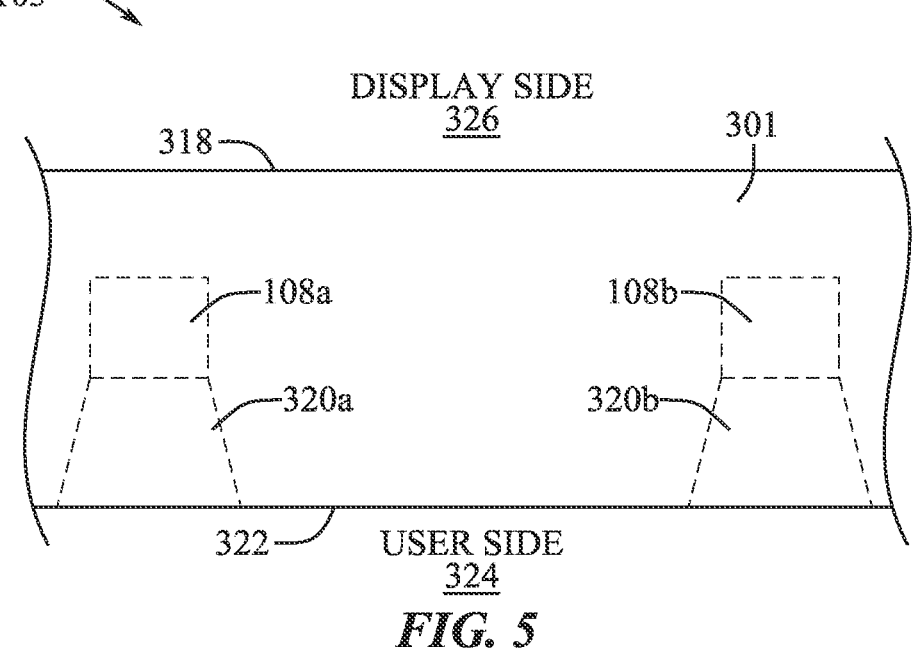
FIG. 5 shows yet another top view of a facial interface with multiple sensors at various positions.

FIG. 5 illustrates yet another example of the facial interface 103, which can include multiple sensors embedded within the interface material 301. FIG. 5 also illustrates none of the sensors 108a, 108b are positioned on the first surface 318. In this example, the sensors 108a, 108b can be wirelessly coupled to a power source and/or an HMD memory/processor component. Indeed, the sensors 108a, 108b can be powered by an inductive coil running through the head-mountable device 100 (e.g., adjacent to the first surface 318). Similarly, the sensors 108a, 108b can be communicatively coupled to an HMD memory/processor component via a wireless communication protocol (e.g., for sending sensor data/sensor signals or receiving sensor feedback).

As further shown in FIG. 5, sensor 108a and sensor 108b are disposed within the interface material 301. Sensors 108a, 108b can be positionally modified to different locations (e.g., laterally, or depth-wise) than illustrated in FIG. 5. Similarly, the sensor 108a can vary in type and configuration, transmission power, shape, and size from the sensor 108b (as indicated above). The field of view 320a of the sensor 108a can vary from the field of view 320b of 108b. In another example, the fields of view 320a, 320b can be the same configuration (also indicated above).

Any of the features, components, and/or parts, including the arrangements and configurations thereof shown in FIG. 5 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 5.

Figure 6A:
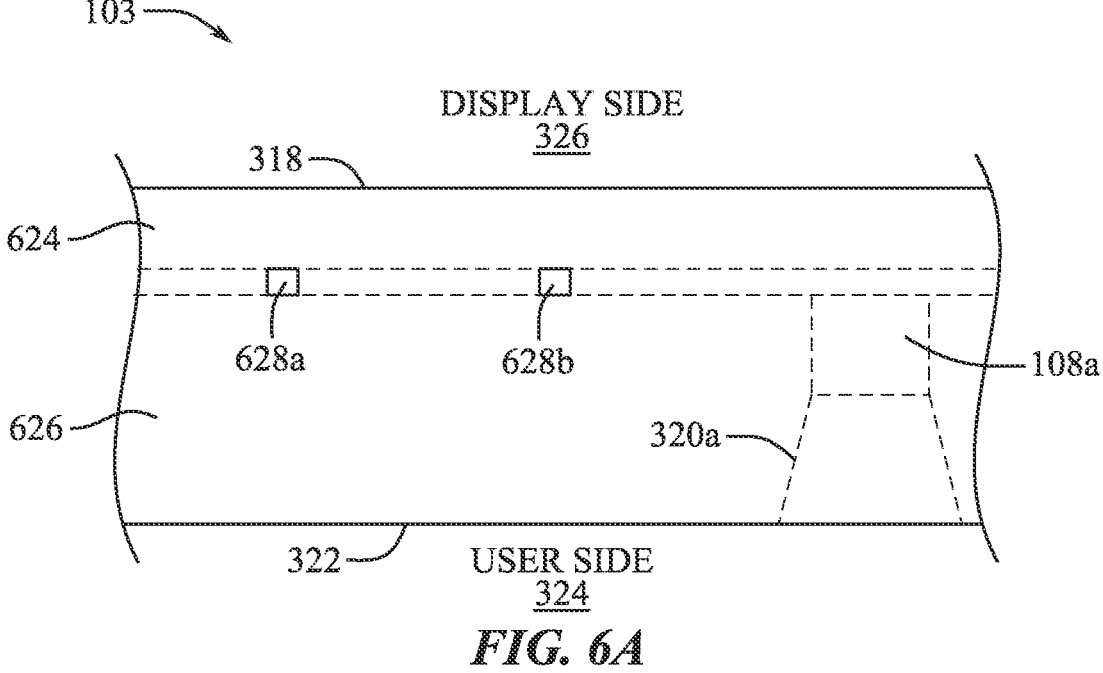
FIG. 6A shows a top view of a facial interface with various components, including a sensor.
Figure 6B:
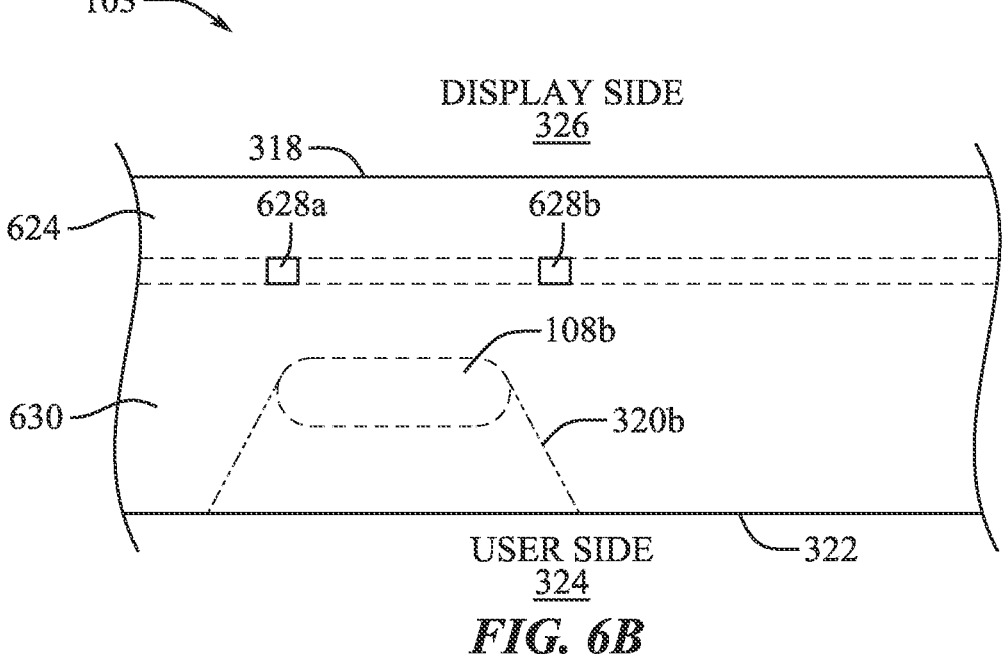
FIG. 6B shows a top view of a facial interface with various components, including a sensor.

FIGS. 6A and 6B illustrate another example of the facial interface 103 comprising multiple layers of interface material. In a particular example shown in FIGS. 6A-6B, the interface material includes a base layer 624 and an interchangeable layer 626. The base layer 624 is affixed to the head-mountable device 100—thereby forming a permanent portion of the facial interface 103. By contrast, the interchangeable layer 626 is removably attached to the base layer 624 (e.g., via fasteners 628a, 628b) such that the interchangeable layer 626 can be swapped out for a different interchangeable layer (e.g., that supports or is designated for a different user activity).

The fasteners 628a, 628b can include myriad different fasteners. For example, the fasteners 628a, 628b can include brooches, buttons, buckles, clasps, eyelets, fabric ties, frog closures, grommets, hook and eyes, laces, loop fasteners, pins, poppers, press studs, snap fasteners, toggles, hook and loop Velcro® tape, zippers, etc. Additionally, rather than fasteners, temporary adhesives (e.g., tape, glue, tack, etc.) can be implement. It will be appreciated that more than two fasteners can be utilized. Additionally, only a single fastener may be implanted in certain instances.

In one example, FIG. 6A shows a configuration where the interchangeable layer 626 of the facial interface 103 can be removably attached to the base layer 624 via the fasteners 628a, 628b. The interchangeable layer 626 can include sensor 108a with a field of view 320a. The sensor 108a can be a wireless biometric sensor, which can include a temperature sensor, a respiration sensor, a heart activity sensor, or a brain activity sensor. Additionally or alternatively, the sensor 108a can include a sensor indicative of certain biological responses (e.g., a stress response). The sensor 108a can be disposed such that the sensor field of view 320a, when oriented toward a region of the face, can detect characteristics unique to the user. In a particular example, the sensor 108a can include an infrared sensor capable of detecting user characteristics, such as body temperature or changes to body temperature.

In another example, FIG. 6B shows a configuration where an additional interchangeable layer 630 of the facial interface 103 can be removably attached to the base layer 624. The additional interchangeable layer 630 can be removably attached to the base layer 624 via the fasteners 628a, 628b, as similarly described above. Different from the interchangeable layer 626, the additional interchangeable layer 630 can include an additional sensor 108b with an additional field of view 320b. Here, the sensor 108b and corresponding field of view differs from the sensor 108a. In this manner, facial interface 103 can be compatible with myriad different interchangeable layers as may be desired for different user activities (or different types of users, such as kids or adults).

Any of the features, components, and/or parts, including the arrangements and configurations thereof shown in FIGS. 6A-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 6A-6B.

Figures 7A, 7B:
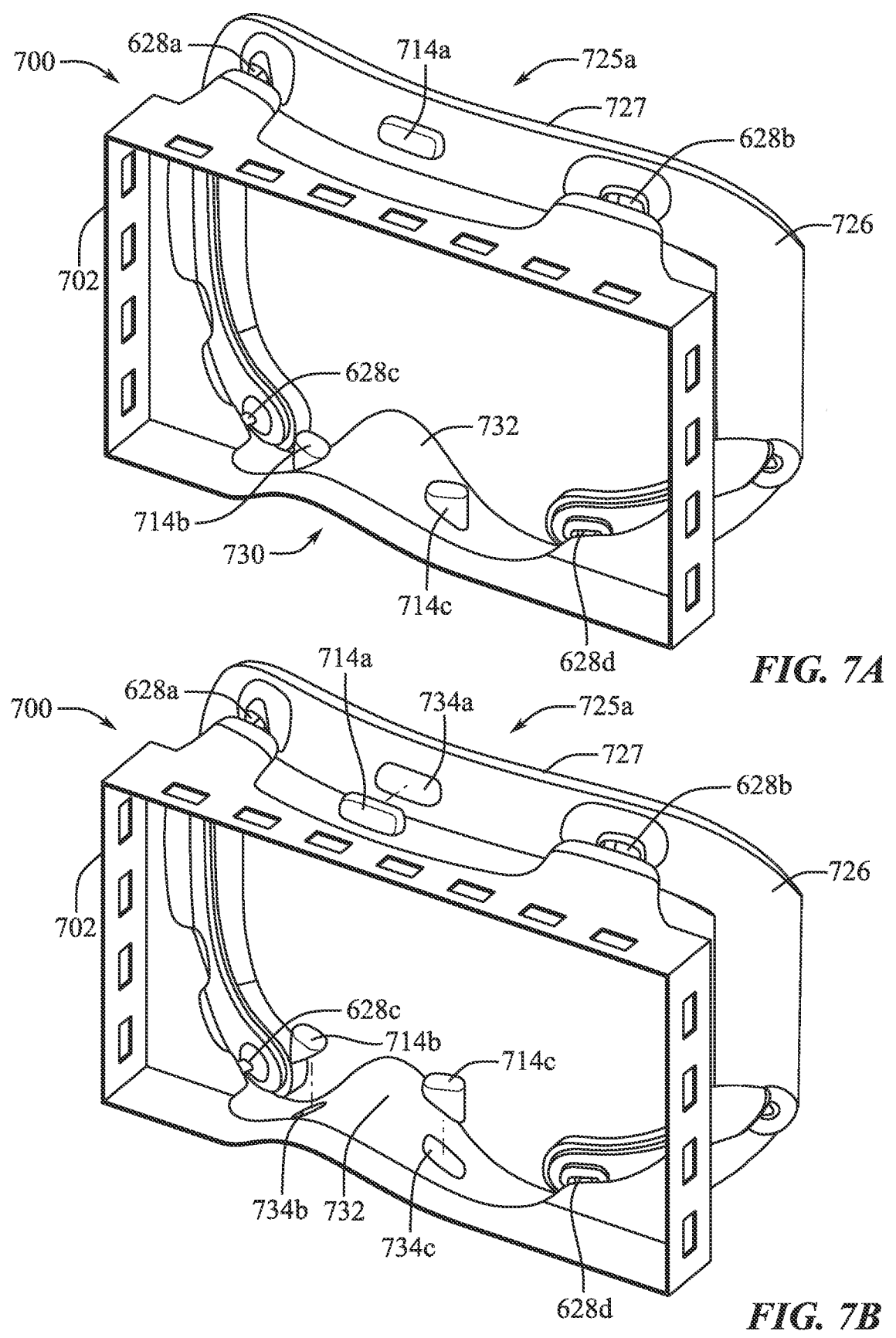
FIG. 7A-7B shows non-exploded and exploded perspective views of a facial interface with sensors.

FIG. 7A illustrates a perspective view of an electronic device 700 including a wearable display 702, an engagement interface 726, and a contactless sensor 714 coupled to the engagement interface 726. In one or more examples, the electronic device 700 is the same as or similar to the head-mountable device 100 described above. For example, the engagement interface 726 can be the same as or similar to the facial interface 103 described above. Similarly, the wearable display 702 can be the same as or similar to the display 102 described above.

The engagement interface 726 is adjustable for different size, shapes, and contours of facial features. For example, the engagement interface 726 can flexibly conform to a user face via connections 628a-628d (e.g., that are the same as or similar to the connections 206 described above). To illustrate, the connections 628a-628d each include pivot connections. However, the connections 628a-628d can be adjusted to include different types of connections (e.g., foam hard stops, leaf springs, compliant mechanisms, etc.).

In another example, the engagement interface 726 includes an interfacing material 727, wherein the contactless sensor 714a can be invisible and inaccessible through a skin-facing surface of the interfacing material 727. The contactless sensor 714a can be oriented toward the first facial region 725a, such a user's forehead, when the device is worn.

In another example, the electronic device includes additional contactless sensors 714b, 714c coupled to the engagement interface 726. The additional contactless sensors 714b, 714c can be mounted on (or within) an engagement interface 732 (e.g., a nose piece). The additional contactless sensors 714b, 714c can be oriented toward a second facial region 730, such as a user's nose, different from the first facial region 725a when the device is worn. In this manner, the contactless sensors 714a-714c can be oriented away from the wearable display 702 (and instead oriented towards a user head or skin, not shown).

FIG. 7B shows a perspective exploded view of the electronic device 700 with sensors 714a, 714b, and 714c. In one example, the sensors can be removably attached to the engagement interfaces 726, 732 (e.g., for swapping out with different sensors). In other examples, the sensors are permanently affixed to the engagement interfaces 726, 732. Additionally, the sensors 714a-714c can be disposed on the engagement interfaces 726, 732 such that the sensors are positioned over corresponding sensorally transparent windows 734a-734c. The sensorally transparent windows 734a, 734b, and 734c allow sensor measurement signals to pass to and from the sensors 714a-714c.

Any of the features, components, and/or parts, including the arrangements and configurations thereof shown in FIGS. 7A-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 7A-7B.

If, in some examples, personal information data is collected by the present exemplary systems and methods, such data can be used to improve the user experience and to customize the interaction with the exemplary system. However, if personal information data is collected, it should only be collected, stored, disseminated, used, and/or destroyed according to generally accepted best practices and protocols.

The foregoing description used specific nomenclature to provide a thorough understanding of the described embodiments, for ease of explanation only. However, the specific details are not required in order to practice the described embodiments. Thus, the foregoing descriptions of the specific embodiments described herein are not intended to be exhaustive or to limit the embodiments to the precise forms disclosed. It will be apparent to one of ordinary skill in the art that many modifications and variations are possible in view of the above teachings.

What is claimed is:

1. An apparatus comprising:
   a display;
   a facial interface;

interface material positioned on the facial interface, the interface material including a first surface that abuts the facial interface, and a second surface opposing the first surface; and
   a sensor positioned within the interface material and oriented towards the second surface, at least a portion of the interface material being transparent to a signal emitted by the sensor and positioned between the sensor and the second surface, wherein the interface material is configured to reduce user irritation.

2. The apparatus of claim 1, wherein the facial interface comprises an area not transparent to the signal emitted by the sensor and an area transparent to the signal emitted by the sensor.

3. The apparatus of claim 2, wherein the sensor is positioned at the area transparent to the signal emitted by the sensor.

4. The apparatus of claim 1, wherein the sensor comprises an infrared sensor.

5. The apparatus of claim 1, wherein the second surface is positioned to abut at least one of a forehead region or a nasal region of a head when the apparatus is donned on the head.

6. The apparatus of claim 1, further comprising a sensor controller, the sensor controller comprising:
   a processor; and
   a memory device storing computer-executable instructions that, when executed by the processor, cause the sensor controller to:
   receive sensor data from the sensor; and
   transmit a signal based on the sensor data.

7. The apparatus of claim 6, wherein in response to the signal, the display performs a function.

8. The apparatus of claim 1, wherein at least one of the facial interface or the interface material is interchangeable with a different facial interface or a different interface material, the different facial interface or the different interface material comprising a different sensor.

9. A head-mountable device, comprising:
   a display;
   a facial interface comprising an interface material; and
   a sensor positioned on the interface material, wherein the interface material is transparent to a signal emitted by the sensor, wherein the interface material is configured to provide user comfort.

10. The head-mountable device of claim 9, wherein the sensor comprises a biometric sensor that includes at least one of a temperature sensor, a respiration sensor, a heart activity sensor, or a brain activity sensor.

11. The head-mountable device of claim 9, wherein the sensor is a wireless sensor.

12. The head-mountable device of claim 9, further comprising support structures movably constrained to the interface material, the sensor being interspaced between the support structures.

13. The head-mountable device of claim 9, wherein the facial interface comprises a pliable region, the sensor being positioned at the pliable region.

14. The head-mountable device of claim 9, wherein the interface material comprises at least one of a foam, a gel, or a fabric.

15. The head-mountable device of claim 9, wherein a portion of the interface material is removably attached via a fastener.

16. A wearable electronic device comprising:
   a display;
   an engagement interface; and a contactless sensor coupled to the engagement interface, the contactless sensor oriented away from the display, wherein the engagement interface is configured to create a distance between the contactless sensor and a user.

17. The wearable electronic device of claim 16, wherein:

the wearable electronic device comprises a head-mountable device; and the engagement interface is adjustable.

18. The wearable electronic device of claim 16, wherein the engagement interface comprises an interfacing material, the contactless sensor being obscured by a skin-facing surface of the interfacing material.

19. The wearable electronic device of claim 16, wherein the contactless sensor is oriented towards a first facial region when the wearable electronic device is worn.

20. The wearable electronic device of claim 19, wherein the contactless sensor comprises a first contactless sensor, and further comprising a second contactless sensor coupled to the engagement interface, the second contactless sensor oriented towards a second facial region different from the first facial region when the wearable electronic device is worn.

* * * * *